(12) United States Patent
Hanao et al.

(10) Patent No.: US 11,375,611 B2
(45) Date of Patent: Jun. 28, 2022

(54) MULTILAYER SUBSTRATE

(71) Applicant: Murata Manufacturing Co., Ltd., Nagaokakyo (JP)

(72) Inventors: Masaaki Hanao, Nagaokakyo (JP); Tsuyoshi Katsube, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 156 days.

(21) Appl. No.: 16/558,575

(22) Filed: Sep. 3, 2019

(65) Prior Publication Data

US 2019/0394874 A1 Dec. 26, 2019

Related U.S. Application Data

(63) Continuation of application No. PCT/JP2018/007945, filed on Mar. 2, 2018.

(30) Foreign Application Priority Data

Mar. 9, 2017 (JP) .............................. JP2017-045012

(51) Int. Cl.
*H05K 1/02* (2006.01)
*H05K 1/03* (2006.01)
*H05K 3/46* (2006.01)
*B32B 9/04* (2006.01)
*B32B 18/00* (2006.01)

(52) U.S. Cl.
CPC ........... *H05K 1/0271* (2013.01); *B32B 9/045* (2013.01); *H05K 1/0306* (2013.01); *H05K 1/036* (2013.01); *H05K 3/4602* (2013.01); *B32B 18/00* (2013.01); *H05K 2201/0116* (2013.01); *H05K 2203/1131* (2013.01); *H05K 2203/1147* (2013.01); *H05K 2203/308* (2013.01); *Y10T 428/249956* (2015.04); *Y10T 428/249987* (2015.04)

(58) Field of Classification Search
CPC .............................. H05K 1/0271; H05K 1/036
See application file for complete search history.

(56) References Cited

U.S. PATENT DOCUMENTS

| 4,882,455 | A | | 11/1989 | Sato et al. |
| 5,144,536 | A | * | 9/1992 | Tsukada ............... H01L 21/4807 |
| | | | | 361/765 |

(Continued)

FOREIGN PATENT DOCUMENTS

| JP | S6226886 A | 2/1987 |
| JP | S62126694 A | 6/1987 |

(Continued)

OTHER PUBLICATIONS

The Engineering Toolbox, "Coefficients of Linear Thermal Expansion", 2013, p. 1-11; https://www.engineeringtoolbox.com/linear-expansion-coefficients-d_95.html.*

(Continued)

*Primary Examiner* — Mark Ruthkosky
*Assistant Examiner* — Julia L Rummel
(74) *Attorney, Agent, or Firm* — ArentFox Schiff LLP (57) ABSTRACT

A multilayer substrate that includes a first ceramic layer that is a dense body, a second ceramic layer that has open pores, and a resin layer adjacent the second ceramic layer, wherein a material of the resin layer is present in the open pores of the second ceramic layer.

16 Claims, 2 Drawing Sheets

(56) References Cited

U.S. PATENT DOCUMENTS

| | | | | |
|---|---|---|---|---|
| 8,304,661 B2* | 11/2012 | Nomiya | ............... | B32B 18/00 |
| | | | | 174/258 |
| 2004/0039127 A1* | 2/2004 | Amou | .................. | H01B 3/441 |
| | | | | 525/328.9 |
| 2010/0224396 A1* | 9/2010 | Nomiya | ............... | B32B 9/005 |
| | | | | 174/258 |
| 2014/0291841 A1* | 10/2014 | Mitsuhashi | .......... | H01L 23/147 |
| | | | | 257/737 |
| 2018/0376594 A1* | 12/2018 | Hanao | .................... | B32B 3/08 |

FOREIGN PATENT DOCUMENTS

| | | | | |
|---|---|---|---|---|
| JP | H04124898 A | 4/1992 | | |
| JP | H0521959 A | 1/1993 | | |
| JP | 2003183085 A | 7/2003 | | |
| WO | 2009069398 A1 | 6/2009 | | |
| WO | WO-2017154692 A1 * | 9/2017 | ............... | B32B 5/16 |

OTHER PUBLICATIONS

MyRo, "Improve your PCB Solderability", 2010, p. 1 and zoomed image; Accessed at www.myropcb.com/improve-your-pcb-solderability/.*

International Search Report issued in PCT/JP2018/007945, dated May 22, 2018.

Written Opinion of the International Searching Authority issued in PCT/JP2018/007945, dated May 22, 2018.

\* cited by examiner

MULTILAYER SUBSTRATE

CROSS REFERENCE TO RELATED APPLICATIONS

The present application is a continuation of International application No. PCT/JP2018/007945, filed Mar. 2, 2018, which claims priority to Japanese Patent Application No. 2017-045012, filed Mar. 9, 2017, the entire contents of each of which are incorporated herein by reference.

FIELD OF THE INVENTION

The present invention relates to a multilayer substrate.

BACKGROUND OF THE INVENTION

As circuit boards used for various electronic apparatuses, substrates in which a resin substrate and a ceramic substrate are combined have been known.

Patent Document 1 discloses a high-heat-dissipation composite substrate in which two sets of ceramic multilayer substrates are disposed interposing an organic thin-film multilayer substrate including an organic insulating film therebetween.

Patent Document 1: Japanese Unexamined Patent Application Publication No. 05-021959

SUMMARY OF THE INVENTION

The composite substrate described in Patent Document 1 has a problem in that the organic insulating film (resin multilayer portion) and the ceramic multilayer substrate are not satisfactorily in close contact with each other. In addition, there is a problem in that when a heat cycle is applied, delamination occurs at the interface between the organic insulating film and the ceramic multilayer substrate due to a difference in the thermal expansion coefficient between the organic insulating film and the ceramic multilayer substrate.

In particular, this problem is considerable in the case in which a low-permittivity material that exhibits low loss in electrical characteristics is used as the material for forming the organic insulating film for high-frequency applications.

The present invention was realized to address the above-described problem, and it is an object to provide a multilayer substrate in which peeling at the interface between a resin layer and a ceramic layer does not readily occur.

A multilayer substrate according to an aspect of the present invention includes a first ceramic layer that is a dense body, a second ceramic layer that has open pores, and a resin layer adjacent the second ceramic layer, wherein a material of the resin layer is present in the open pores of the second ceramic layer.

In the multilayer substrate according to an aspect of the present invention, the resin layer and the second ceramic layer are adjacent to each other.

In addition, since the second ceramic layer has open pores and the resin material of the resin layer is present in the open pores, an anchor effect is exerted so as to improve the bonding strength at the interface between the resin layer and the second ceramic layer.

Meanwhile, since the material of the resin layer is present in the open pores of the second ceramic layer, the thermal expansion coefficient of the resulting portion lies about halfway between the thermal expansion coefficient of a second ceramic material constituting the second ceramic layer and the thermal expansion coefficient of the material of the resin layer. As a result, the portion in which the material of the resin layer has diffused into the second ceramic layer can function as a relaxation portion to relax stress due to a difference in the thermal expansion coefficient between the second ceramic layer and the resin layer.

As a result of interactions between these, a composite substrate in which peeling at the interface between the resin layer and the ceramic layer does not readily occur can be produced.

Further, since the first ceramic layer is a dense body and, therefore, is a layer having high strength, the presence of the first ceramic layer can increase the strength of the entire multilayer substrate.

In the multilayer substrate according to an aspect of the present invention, preferably, the sintering temperature of a first ceramic material constituting the first ceramic layer is lower than the sintering temperature of a second ceramic material constituting the second ceramic layer.

When the sintering temperature of the first ceramic material is lower than the sintering temperature of the second ceramic material, setting the sintering temperature during production of the multilayer substrate to be a temperature higher than or equal to the sintering temperature of the first ceramic material and lower than the sintering temperature of the second ceramic material enables the first ceramic material to be sintered into a dense body and enables the second ceramic material to remain unsintered, in a firing step.

The second ceramic layer composed of the unsintered second ceramic material is a layer having open pores.

That is, using the first ceramic material and the second ceramic material that are in the above-described sintering temperature relationship enables the substrate including the first ceramic layer that is a dense layer and the second ceramic layer that has open pores to be produced by one operation of the firing step.

In the multilayer substrate according to an aspect of the present invention, preferably, the second ceramic layer is composed of an unsintered ceramic material.

Since the unsintered ceramic material is not a dense body but has open pores, the material for forming the resin layer are favorably diffused.

In the multilayer substrate according to an aspect of the present invention, preferably, the second ceramic layer has a three-dimensional network structure.

The three-dimensional network structure refers to a structure in which ceramic particles are three-dimensionally arranged and intertwined into a network shape and in which pores are also continuously three-dimensionally arranged and intertwined into a network shape. Examples of the three-dimensional network structure include the structure described in Japanese Unexamined Patent Application Publication No. 2003-183085.

When the second ceramic layer has the three-dimensional network structure, the material of the resin layer diffuses into the three-dimensional network structure through the open pores, and, thereby, forms a complex dendritic structure so as to intertwine therewith. Consequently, an effect of improving the bonding strength at the interface between the resin layer and the second ceramic layer due to an anchor effect can be enhanced.

In the multilayer substrate according to an aspect of the present invention, the porosity of the second ceramic layer is preferably 10% to 80%.

When the porosity is 10% or more, a sufficient amount of the material for forming the resin layer diffuses into the second ceramic layer. Consequently, the effect of improving the bonding strength at the interface between the resin layer and the second ceramic layer due to the anchor effect and the function as the relaxation portion to relax the stress due to a difference in the thermal expansion coefficient are satisfactorily exerted. Meanwhile, the porosity is preferably 80% or less because the strength of the second ceramic layer is not excessively weakened.

In the multilayer substrate according to an aspect of the present invention, preferably, the resin layer is disposed as any one outermost layer or as both outermost layers of the multilayer substrate.

Regarding a multilayer substrate having a configuration in which no second ceramic layer is disposed and in which the resin layer is in direct contact with the first ceramic layer, a warp may occur due to a difference in the thermal expansion coefficient between the resin layer and the first ceramic layer.

In this regard, when a multilayer substrate in which the arrangement is (resin layer)-(second ceramic layer)-(first ceramic layer) from above is assumed, the second ceramic layer does not shrink compared with the first ceramic layer. Therefore, from the relationship between the two layers, there is a tendency to warp convexly. On the other hand, from the relationship between the second ceramic layer and the resin layer, there is a tendency to warp concavely due to shrinkage of the resin during curing. The directions of the two types of warp are opposite to each other, the forces that cause warps are cancelled each other, and as a result, the multilayer substrate with a reduced degree of warp as a whole can be produced.

According to the present invention, a multilayer substrate in which peeling at the interface between a resin layer and a ceramic layer does not readily occur can be provided.

DETAILED DESCRIPTION OF THE PREFERRED EMBODIMENTS

A multilayer substrate according to an embodiment of the present invention will be described below. However, the present invention is not limited to the configuration described below, and the configuration can be appropriately modified and applied within the bounds of not changing the gist of the present invention. The present invention also includes combinations of at least two individual desirable configurations of the multilayer substrate according to an embodiment of the present invention described below.

First Embodiment

Figure 1:
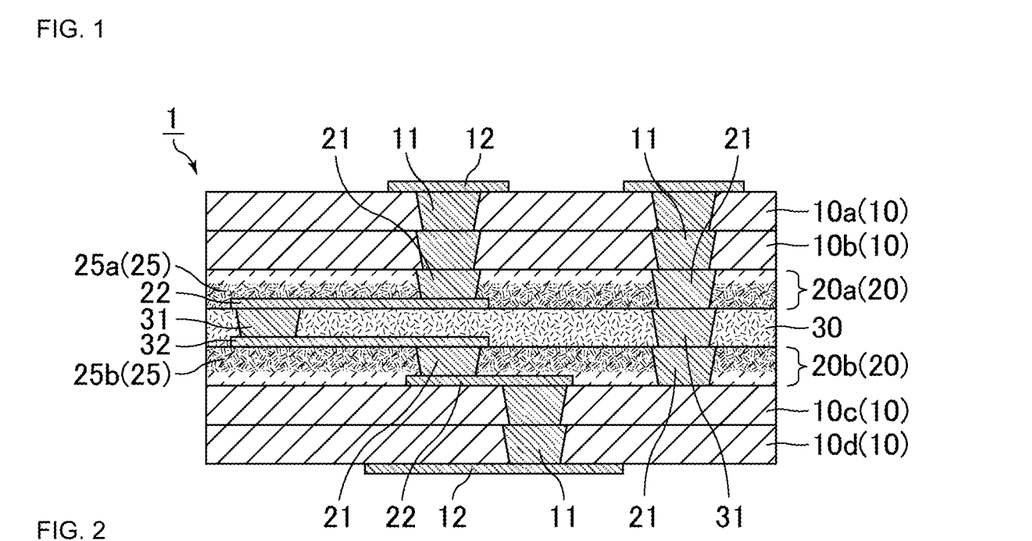
FIG. 1 is a schematic sectional view showing an example of a multilayer substrate according to the present invention.

FIG. 1 is a schematic sectional view showing an example of the multilayer substrate according to the present invention. The multilayer substrate 1 shown in FIG. 1 includes first ceramic layers 10 (10a, 10b, 10c, and 10d) that are dense bodies, second ceramic layers 20 (20a and 20b) that have open pores, and a resin layer 30. The second ceramic layers 20 are adjacent to the resin layer 30, and a material for forming the resin layer 30 diffuses into the second ceramic layers 20 (regions indicated by references 25a and 25b in FIG. 1).

The first ceramic layers 10 are provided with metal conductors 11 and metal wiring lines 12, the second ceramic layers 20 are provided with metal conductors 21 and metal wiring lines 22, and the resin layer 30 is provided with metal conductors 31 and a metal wiring line 32.

The first ceramic layer 10 is a ceramic layer that is a dense body. Here, "dense body" refers to a first ceramic layer with substantially no pores. Preferably, the first ceramic layer is composed of a sintered ceramic material. Preferably, the first ceramic material that is a ceramic material constituting the first ceramic layer contains a low-temperature-sintering ceramic material. Here, "low-temperature-sintering ceramic material" refers to, of ceramic materials, a material that can be sintered at a firing temperature of 1,000° C. or lower and that can be fired at the same time with silver or copper, either of which is favorably used as a metal material.

Specifically, regarding the low-temperature-sintering ceramic material, glass-composite-based low-temperature-sintering ceramic materials produced by mixing borosilicate glass into ceramic materials such as quartz, alumina, and forsterite, crystallized-glass-based low-temperature-sintering ceramic materials by using $ZnO$—$MgO$—$Al_2O_3$—$SiO_2$-based crystallized glass, and non-glass-based low-temperature-sintering ceramic materials by using $BaO$—$Al_2O_3$—$SiO_2$-based ceramic materials, $Al_2O_3$—$CaO$—$SiO_2$—$MgO$—$B_2O_3$-based ceramic materials, or the like may be used.

The first ceramic layer is a dense body and is therefore a layer having high strength. Consequently, the presence of the first ceramic layer enables the strength of the entire multilayer substrate to be enhanced. The thickness of the first ceramic layer is preferably 2 µm to 100 µm per layer and more preferably 5 µm to 60 µm per layer.

The second ceramic layer 20 is a ceramic layer having open pores. The porosity of the second ceramic layer is preferably 10% to 80%. The porosity is more preferably 30% to 60%. When the porosity is 10% or more, a sufficient amount of the material for forming the resin layer diffuses into the second ceramic layer. Consequently, the effect of improving the bonding strength at the interface between the resin layer and the second ceramic layer due to an anchor effect and the function as the relaxation portion to relax the stress due to a difference in the thermal expansion coefficient are satisfactorily exerted. Meanwhile, the porosity is preferably 80% or less because the strength of the second ceramic layer is not excessively weakened.

The porosity of the second ceramic layer in the multilayer substrate may be determined from the ratio of the bulk density of the second ceramic layer with respect to the second ceramic layer after the firing step in the production process to the true density of the second ceramic material.

In this regard, when the porosity is determined with respect to the multilayer substrate in which the material for forming the resin layer has diffused into the second ceramic layer, a method in which a cross section of the second ceramic layer is exposed by mechanical polishing or ion milling and in which the ratio of the resin portion to the ceramic portion is calculated by using a surface observation apparatus, such as a SEM, EDX, or WDX, may be used.

The pore diameter (average pore diameter) of pores included in the second ceramic layer is preferably 10 µm or less. The second ceramic layer after the firing step in the production process is removed, and the pore diameter of the second ceramic layer may be determined by a method, for example, a mercury penetration method.

Meanwhile, when the average pore diameter is determined with respect to the multilayer substrate in which the material for forming the resin layer has diffused into the second ceramic layer, a method in which a cross section of the second ceramic layer is exposed by mechanical polishing or ion milling and in which the average pore diameter is calculated from the size of the resin portion observed by using a surface observation apparatus, such as a SEM, EDX, or WDX, may be used.

Preferably, the second ceramic layer is composed of an unsintered ceramic material. In this regard, preferably, the second ceramic material is a ceramic material containing a metal oxide that has a high sintering temperature and that does not sinter substantially at the sintering temperature of the low-temperature-sintering ceramic material. Examples of the metal oxide that does not sinter substantially at the sintering temperature of the low-temperature-sintering ceramic material include alumina, silica, zirconia, titania, niobium pentoxide, tantalum pentoxide, and magnesia. Of these, alumina and silica are preferable. In this regard, a ceramic material in which alumina or zirconia is used as a primary component and in which a softenable material such as borosilicate-based glass is contained to adjust a sintering temperature is more preferable.

Since it is preferable that the second ceramic material be the above-described material, a preferable relationship with the first ceramic material is such that the sintering temperature of the first ceramic material is lower than the sintering temperature of the second ceramic material.

Preferably, the second ceramic layer has a three-dimensional network structure. More preferably, a three-dimensional network structure is disposed in a region located at a depth of 1 μm to 100 μm from the surface of the second ceramic layer. When the second ceramic layer has a three-dimensional network structure, the material for forming the resin layer diffuses into the three-dimensional network structure through open pores and thereby forms a complex dendritic structure so as to intertwine therewith. Consequently, an effect of improving the bonding strength at the interface between the resin layer and the second ceramic layer due to an anchor effect can be enhanced. The dimensional network structure is as described above in detail.

The thickness of the second ceramic layer is preferably 1 μm to 100 μm per layer and more preferably 2.5 μm to 50 μm per layer.

The resin layer 30 is a layer adjacent to the second ceramic layer 20. In this regard, the material for forming the resin layer diffuses into the second ceramic layer. The material for forming the resin layer enters into the open pores included in the second ceramic layer. As a result, in the second ceramic layer, specifically in the region having a predetermined thickness from the boundary portion between the resin layer and the second ceramic layer, there is a portion in which a ceramic-resin composite material composed of the material forming the resin layer and the second ceramic material exists.

The thermal expansion coefficient of this portion lies about halfway between the thermal expansion coefficient of the second ceramic material constituting the second ceramic layer and the thermal expansion coefficient of the material forming the resin layer. As a result, the portion in which the material forming the resin layer has diffused into the second ceramic layer can function as a relaxation portion to relax stress due to a difference in the thermal expansion coefficient between the second ceramic layer and the resin layer. In FIG. 1, the relaxation portions are indicated by references 25a and 25b.

Preferably, the relaxation portion is disposed in a region located at a depth of 1 μm to 100 μm from the boundary between the resin layer and the second ceramic layer. In addition, it is preferable that the relaxation portion be disposed in the region from the position that corresponds to 5% or more of the thickness of the second ceramic layer from the resin layer to the position that corresponds to 100% or less.

Regarding the resin material constituting the resin layer, any resin material having characteristics and functions that are intended to be conferred to the multilayer substrate may be used. Preferably, for example, fluororesins, silicone rubber, and hydrocarbon-based resins having a small number of polar groups (for example, polyethylenes, polypropylenes, and polystyrenes) may be used. Specifically, for example, fluororesins having a permittivity εr of about 2.6, silicone rubber having a permittivity εr of about 3.0, polyethylenes having a permittivity εr of about 2.25, polypropylenes having a permittivity εr of about 2.2, and polystyrenes having a permittivity εr of about 2.45 may be used more preferably.

These resin materials have low permittivity and are therefore suitable for resin materials that constitute resin layers to reduce transmission loss in a high-frequency region.

Meanwhile, it is preferable that voids be present in the resin layer, and it is also preferable that void-forming materials, for example, hollow beads, be contained in the resin layer. It is also preferable that voids be present and that void-forming materials be additionally contained in the resin layer. The presence of voids or void-forming materials in the resin layer enables the permittivity of the resin layer to be reduced and is therefore suitable for constituting the resin layer to reduce transmission loss in a high-frequency region. Further, it is preferable that the relative permittivity εr of the resin layer be 1.5 to 3.

The relative permittivity of the resin layer is not equal to the relative permittivity of the resin material but is equal to the relative permittivity measured with respect to the entire resin layer. In the case in which voids, void-forming materials, or other insulating materials, for example, fillers, are contained in the resin layer, the contribution of each of these is included.

In this regard, the resin layer containing void-forming materials can decrease a difference in the thermal expansion coefficient between the resin layer and the ceramic layer and improve the heat cycle characteristics.

Regarding the void-forming material, hollow beads may be used. Examples of the hollow beads include beads having a shell layer containing at least one inorganic substance selected from a group consisting of $SiO_2$, $Al_2O_3$, $ZrO_2$, $TiO_2$, and MgO as a primary component, the inside of the shell layer being hollow. In particular, it is preferable that the shell layer contain $SiO_2$ as a primary component. In this regard, close-type hollow beads in which hollow portions are entirely covered with shell layers are preferable.

The proportion of the void-forming materials in the resin layer is preferably 20% by volume or more, and more preferably 40% by volume or more.

Regarding resin materials having a low tensile modulus of elasticity, preferably, fluororesins, polyimide-based resins, polyether-ketone-based resins, polyphenylene-sulfide-based resins, and cycloolefin-based resins are used.

More preferable specific examples include fluororesins having a tensile modulus of elasticity E (GPa) of about 0.39 to 0.55 and cycloolefin-based resins having a tensile modulus of elasticity E (GPa) of about 2.1 to 2.2. These resin materials have a low tensile modulus of elasticity and are therefore suitable for resin materials to constitute resin layers serving as stress relaxation layers against an impact. In this regard, the tensile modulus of elasticity of the resin layer is preferably 0.02 GPa to 3 GPa. The tensile modulus of elasticity of the resin layer is more preferably 0.02 GPa to 1 GPa. Meanwhile, materials such as rubber-based materials and thermoplastic elastomers (vinyl chloride-based, styrene-based, olefin-based, ester-based, urethane-based, amide-based, and the like) may be used. The tensile modulus of elasticity of the resin layer is not equal to the tensile modulus of elasticity of the resin material but is equal to the tensile modulus of elasticity measured with respect to the entire resin layer.

The thickness of the resin layer is preferably 2 μm to 300 μm, and more preferably 5 μm to 100 μm.

FIG. 1 shows an example in which the interlayer connection metal conductor 11 in the first ceramic layer 10, the interlayer connection metal conductor 21 in the second ceramic layer 20, and the interlayer connection metal conductor 31 in the resin layer 30 are integrated.

Integration of the interlayer connection metal conductor in the first ceramic layer, the interlayer connection metal conductor in the second ceramic layer, and the interlayer connection metal conductor in the resin layer, as described above, is one of the preferred embodiments of the multilayer substrate according to the present invention.

As will be described later, the multilayer substrate according to the present invention may be produced by a production method including the step of integrally firing the interlayer connection metal conductor in the first ceramic layer, the interlayer connection metal conductor in the second ceramic layer, and the interlayer connection metal conductor in the resin layer. The multilayer substrate in which the interlayer connection metal conductors in these layers are integrated is not produced by a production method in which a resin substrate including a metal conductor and a ceramic substrate including a metal conductor are bonded to each other.

In the present specification, the concept of integrating the interlayer connection metal conductor in the first ceramic layer, the interlayer connection metal conductor in the second ceramic layer, and the interlayer connection metal conductor in the resin layer is not limited to the case in which the metal conductors are linearly aligned and integrated into a columnar metal conductor as shown in the right-hand portion of FIG. 1. The case in which interlayer connection metal conductors are integrated with a metal wiring line formed in the direction of a plane interposed therebetween as shown in the left-hand portion of FIG. 1 is also included.

Regarding each of the first ceramic layer, the second ceramic layer, and the resin layer, preferably, both the material constituting the interlayer connection metal conductor and the material constituting the metal wiring line are a mixture of a metal material and a ceramic material.

Regarding the metal material, preferably, at least one type selected from gold, silver, and copper is contained, and more preferably, silver or copper is contained. Gold, silver, and copper have low resistance and are therefore particularly suitable in the case in which the multilayer substrate is used at high frequency.

Regarding the ceramic material contained in the materials that constitute the metal conductor and the metal wiring line, the same material as for the first ceramic material is favorably used. Consequently, the sintering behavior of the first ceramic material and the sintering behavior of the metal conductor paste can be matched.

The proportion of the metal material contained in the interlayer connection metal conductor in the resin layer is preferably 40% by weight to 99% by weight, more preferably 60% by weight to 90% by weight. The proportion of the metal material contained in the metal conductor being 99% by weight or less denotes the metal conductor in the resin layer being different from a metal conductor that is formed by a method such as plating, which is a metal conductor forming method frequently adopted for a resin substrate, and that has a metal-only composition. The metal conductor can be formed by firing a metal conductor paste. However, as described later, since materials other than the metal material, for example, a ceramic material, are contained in the metal conductor produced through firing the metal conductor paste, the resulting composition is not composed of the metal material only. The metal conductor formed through firing the metal conductor paste can form strong bonds compared with the metal conductor that is formed by plating or the like without being fired and that is composed of the metal material only, and the connection reliability can therefore be further enhanced.

Likewise, the proportion of the metal material contained in the interlayer connection metal conductors in the first ceramic layer and the second ceramic layer is preferably 40% by weight to 99% by weight, more preferably 60% by weight to 90% by weight.

The proportion of the metal material contained in the interlayer connection metal conductor is set to be preferably 40% by weight or more because the resistance of the multilayer substrate does not excessively increase.

It is preferable that the interlayer connection metal conductor in the resin layer and the interlayer connection metal conductors in the first ceramic layer and the second ceramic layer have the same composition. The interlayer connection metal conductor in the resin layer and the interlayer connection metal conductors in the first ceramic layer and the second ceramic layer have the same composition when the metal conductors are formed by using metal conductors having the same composition and by performing co-firing.

In this regard, although not identical, the compositions are sufficiently similar, and accordingly the interlayer connection metal conductor in the resin layer, the first ceramic layer, and the second ceramic layer have much the same favorable characteristics. Specifically, a difference between the proportion (% by weight) of the metal material contained in the interlayer connection metal conductor in the resin layer and the proportion (% by weight) of the metal material contained in the interlayer connection metal conductors in the first ceramic layer and the second ceramic layer is preferably 59% by weight or less. The difference is more preferably 30% by weight or less because the characteristics of the metal conductors at the interface are readily equalized with each other. The lower limit of the above-described difference is 0% by weight (the compositions of the metal conductors are the same), but the lower limit may be 0.001% by weight (the above-described difference is 0.001% by weight or more).

The resin layer may be provided with a multilayer wiring line. The resin layer that serves as an insulating layer constituting the resin layer is one layer because of being formed by one operation of resin impregnation as described later. However, stacking of the interlayer connection metal conductors may be stacked to form a plurality of steps.

FIG. 1 shows the configuration in which only one resin layer is disposed. However, a plurality of resin layers may be disposed. For example, the multilayer substrate according to the present invention includes a multilayer substrate having a layer configuration such as "(first ceramic layer)-(second ceramic layer)-(resin layer)-(second ceramic layer)-(resin layer)-(second ceramic layer)-(first ceramic layer)".

FIG. 1 shows the aspect in which both principal surfaces of the resin layer are adjacent to the second ceramic layers. However, at least one principal surface of the resin layer has to be adjacent to the second ceramic layer, and the other principal surface may be adjacent to the first ceramic layer.

<Method for Producing Multilayer Substrate>

Figure 2:
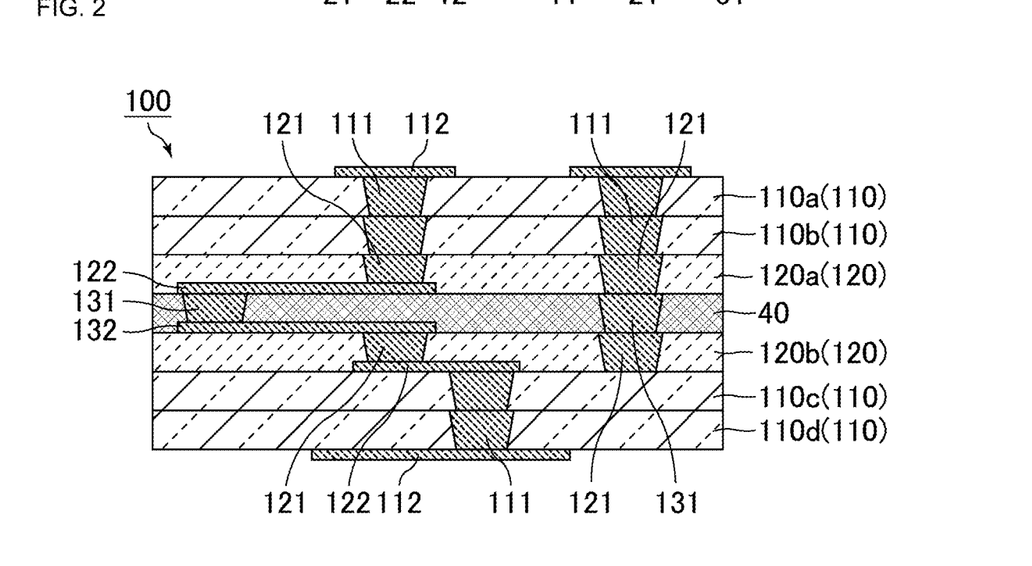
FIG. 2 is a schematic sectional view showing some steps of the method for producing the multilayer substrate according to the present invention.
Figure 3:
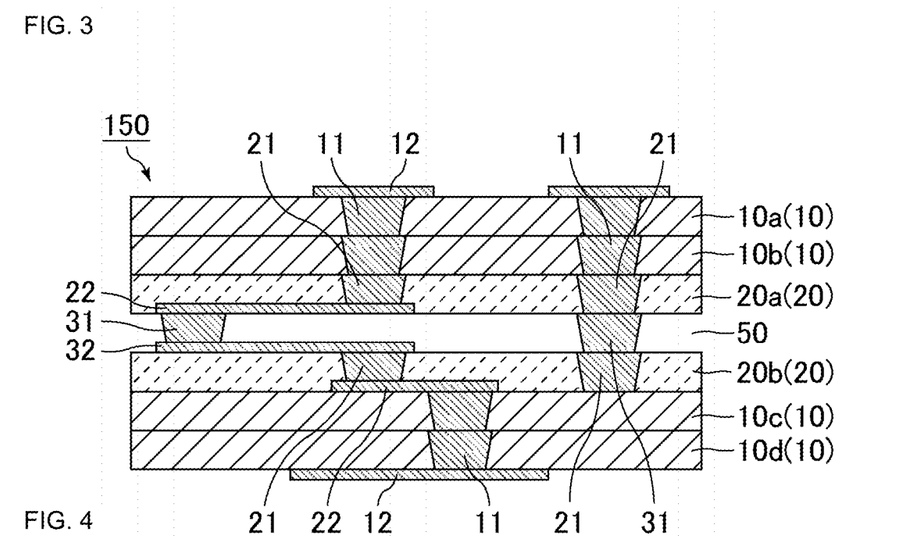
FIG. 3 is a schematic sectional view showing some steps of the method for producing the multilayer substrate according to the present invention.

Next, an example of the method for producing the multilayer substrate will be described. FIG. 2 and FIG. 3 are schematic sectional views showing some steps of the method for producing the multilayer substrate according to the present invention.

Initially, regarding ceramic green sheets, first ceramic green sheets serving as the first ceramic layers and second ceramic green sheets serving as the second ceramic layers are prepared.

The first ceramic green sheet is produced by forming a slurry containing a glass ceramic, in which alumina and borosilicate glass are mixed, serving as an unsintered low-temperature-sintering ceramic material, a powder serving as a raw material for a Ba—Al—Si—O-based ceramic that produces a glass component during firing, an organic binder, and a solvent into the shape of a sheet by a doctor blade method or the like. The above-described slurry may contain various additives, for example, a dispersing agent and a plasticizer.

The second ceramic green sheet is produced by forming a slurry containing an alumina powder, which is an example of a metal oxide that does not sinter substantially at a sintering temperature of a low-temperature-sintering ceramic powder, an organic binder, and a solvent into the shape of a sheet by the doctor blade method or the like. The above-described slurry may contain glass in addition to the metal oxide and may further contain various additives, for example, a dispersing agent and a plasticizer.

Examples of the organic binder contained in each slurry include butyral resins (polyvinyl butyrals), acrylic resins, and methacrylic resins. Examples of the solvent include toluene and alcohols, for example, isopropylene alcohol. Examples of the plasticizer include di-n-butyl phthalate.

Each ceramic green sheet is bored by a laser or a mechanical punch, and each hole is filled with an interlayer connection metal conductor paste. In addition, wiring lines and electrodes are formed on the ceramic green sheets by a screen printing method or the like using a metal conductor paste.

Regarding the metal conductor paste, preferably, a paste that contains the above-described metal material and the unsintered low-temperature-sintering ceramic material contained in the first ceramic green sheet is used. Preferably, the metal conductor paste contains a solvent, an organic binder, and the like.

In the above-described procedure, the first ceramic green sheets and the second ceramic green sheets are prepared.

A cavity-forming sheet is prepared separately. The cavity-forming sheet is a sheet that is composed of a cavity-forming material which is a material to burn off during the firing step performed later so as to form a cavity in the place of the cavity-forming material and that has an interlayer connection metal conductor paste.

Preferably, the cavity-forming material is a material exhibiting a weight reduction rate of 10% or less during firing for 1 hour at the sintering start temperature of the metal conductor paste in the cavity-forming sheet and a weight reduction rate of 99% or more during firing for 1 hour at the firing temperature during the firing step. Preferably, the cavity-forming material is a material that burns off at a temperature lower than or equal to the firing temperature (preferably 800° C. to 1,000° C.). Specifically, it is preferable that the material burn off at a temperature of 850° C. to 950° C. Preferably, the cavity-forming material is carbon, and it is preferable that a carbon sheet be used as the cavity-forming sheet.

The carbon sheet may be obtained by adding an organic binder, a dispersing agent, and a plasticizer to carbon, performing mixing and pulverization so as to obtain a slurry, forming the resulting slurry into the shape of a sheet on a base material film by a doctor blade method, and performing drying. The thickness of the cavity-forming sheet may be appropriately set in accordance with the thickness of a cavity to be formed by the firing step and is set to be preferably 5 μm or more and 100 μm or less. In this regard, the thickness is set to be more preferably 5 μm or more and 50 μm or less. Meanwhile, a commercially available carbon sheet (graphite sheet) may also be used.

In the same manner as each ceramic green sheet, the cavity-forming sheet is bored by a laser or a mechanical punch, and each hole is filled with an interlayer connection metal conductor paste. In addition, wiring lines and electrodes are formed on the cavity-forming sheet by a screen printing method or the like using a metal conductor paste.

In this regard, the cavity-forming sheet after being bored may be filled with a ceramic paste having the same composition as the ceramic paste used for producing the first ceramic green sheet. In the above-described procedure, the cavity-forming sheet that is composed of the cavity-forming material and that includes the interlayer connection metal conductor paste is prepared.

Subsequently, the ceramic green sheets and the cavity-forming sheet are stacked such that the second ceramic green sheet and the cavity-forming sheet are adjacent to each other. FIG. 2 schematically shows a multilayer body before firing, in which the first ceramic green sheets, the second ceramic green sheets, and the cavity-forming sheet are stacked. In the multilayer body 100 before firing shown in FIG. 2, two first ceramic green sheets 110 (110*d*, 110*c*) are stacked from the bottom, one second ceramic green sheet 120 (120*b*) is stacked thereon, and one cavity-forming sheet 40 is stacked thereon. Further, one second ceramic green sheet 120 (120*a*) is stacked thereon, and two first ceramic green sheets 110 (110*b*, 110*a*) are stacked thereon. Each of the second ceramic green sheet 120*a* and the second ceramic green sheet 120*b* is adjacent to the cavity-forming sheet 40. In this regard, there is no particular limitation regarding the number of the first and second ceramic green sheets and the number of the cavity-forming sheets.

In FIG. 2, of the metal conductor pastes before firing, the interlayer connection metal conductor pastes are indicated by references 111, 121, and 131, and the wiring lines formed by using the metal conductor paste are indicated by references 112, 122, and 132. A multilayer body before firing may be obtained by heat-pressure bonding the multilayer body in which the ceramic green sheets and the cavity-forming sheet are stacked.

In this regard, there is no particular limitation regarding the order of the processes provided that the multilayer body having the same configuration is obtained. A build-up system may be adopted, where a material for forming each layer is stacked while being subjected to boring, filling with a metal conductor paste, and printing rather than stacking each layer that has been made into the shape of a sheet.

Subsequently, the firing step of firing the multilayer body is performed. In the firing step, firing is performed at a firing temperature that is higher than or equal to the sintering temperatures of the first ceramic material contained in the first ceramic green sheet and the metal conductor paste contained in each layer and that is lower than or equal to the sintering temperature of the second ceramic material. The first ceramic material sinters during the firing step so as to form the first ceramic layer that is a dense body. Meanwhile, the metal conductor pastes contained in the respective layers integrally sinter so as to form the interlayer connection metal conductors. The second ceramic material contained in the second ceramic green sheet does not sinter and, therefore, remains unsintered so as to become a layer having open pores. The layer resulting from the second ceramic green sheet that has been subjected to the firing step is the second ceramic layer. In this regard, the cavity-forming material burns off so as to form a cavity at the location adjacent to the second ceramic layer.

FIG. 3 schematically shows a substrate after firing, that has been subjected to the firing step. In the substrate 150 after firing, and as shown in FIG. 3, the unsintered first ceramic material in the first ceramic green sheets 110, the interlayer connection metal conductor pastes 111, and the wiring lines 112 of FIG. 2, are sintered so as to become the first ceramic layers 10, the metal conductors 11, and the metal wiring lines 12, respectively. The interlayer connection metal conductor pastes 121 in the second ceramic green sheets 120 and the wiring lines 122 of FIG. 2, sinter so as to become the metal conductors 21 and the metal wiring lines 22, respectively. The second ceramic material remains unsintered and becomes second ceramic layers 20 having open pores.

Regarding the portion that is the cavity-forming sheet 40 in FIG. 2, the interlayer connection metal conductor pastes 131 and the wiring lines 132 sinter so as to become the interlayer connection metal conductors 31 and the metal wiring lines 32, respectively. In this regard, carbon serving as the cavity-forming material burns off so as to form a cavity 50 in the portion in which the carbon has been present. The thickness of the cavity 50 is determined in accordance with the total thickness of the cavity-forming sheets. The predetermined thickness of the cavity 50 is maintained by the metal conductor 31 and the metal wiring line 32 being firmly bonded to each other by sintering.

There is no particular limitation regarding the firing temperature during the firing step. In general, 800° C. to 1,000° C. is preferable.

There is no particular limitation regarding the firing atmosphere, and examples include an air atmosphere and a low-oxygen atmosphere. In the present specification, a low-oxygen atmosphere refers to an atmosphere having a lower oxygen partial pressure than air, and examples include inert gas atmospheres, for example, a nitrogen atmosphere and an argon atmosphere, atmospheres in which inert gas such as nitrogen is mixed into air, and a vacuum atmosphere. In this regard, a mixed gas atmosphere of nitrogen and hydrogen may be adopted.

Regarding the firing step, a constraining-layer-composite multilayer body having a structure in which a first constraining layer and a second constraining layer that contain an inorganic material not sintering substantially at the firing temperature are in close contact with respective principal surfaces of the ceramic green sheet located at the outermost portion of the multilayer body before firing may be prepared, and the constraining-layer-composite multilayer body may be fired so as to obtain a fired substrate interposed between the first constraining layer and the second constraining layer.

According to the above-described method, since the constraining layers constrain shrinkage of the ceramic green sheets (in particular, first ceramic green sheets) during firing, shrinkage occur only in the thickness direction of the ceramic green sheet, and shrinkage in the principal surface direction does not occur substantially. Consequently, the dimensional accuracy of the multilayer substrate produced can be improved.

Subsequently, a resin layer forming step of forming a resin layer in the cavity is performed. A method in which a liquid containing a resin material is prepared, the substrate having the cavity is dipped into the liquid so as to impregnate the cavity with the resin material, and curing the resin material is used as the method for forming the resin layer. Regarding the liquid containing the resin material, the resin material may be just a liquid, or the liquid may be a resin solution, an emulsion, or a latex, which is obtained by mixing the resin material with a solvent. Alternatively, a liquid that is obtained by heating the resin material to the softening temperature or higher and that has fluidity may be adopted. Further, as the situation demands, a plasticizer, a dispersing agent, a curing agent, and the like may be added to the liquid containing the resin material. In the case in which the resin material is a curable resin such as a thermosetting resin or a photo-curable resin, the resin material may be cured in accordance with the curing condition of each resin. Meanwhile, in the case of a thermoplastic resin, the resin material may be heated so as to become a liquid having fluidity, the cavity may be impregnated with the resulting liquid, and solidification may be performed by decreasing the temperature. Solidification of the resin material by such a procedure is also included in "curing of resin material" in the present specification.

When the cavity is impregnated with the liquid containing the resin material, open pores of the second ceramic layer adjacent to the cavity are impregnated with the liquid containing the resin material and, therefore, the material for forming the resin layer diffuses into the second ceramic layer. To impregnate open pores of the second ceramic layer with the resin material, preferably, impregnation is performed in a vacuum. When the substrate having the cavity is placed in a vacuum (under reduced pressure), air in the open pores is removed, the resulting substrate is dipped into the liquid containing the resin material, and the pressure is returned to atmospheric pressure, the open pores of the second ceramic layer are impregnated with the resin solution efficiently. In the above-described steps, the multilayer substrate according to the present invention shown in FIG. 1 may be produced.

Alternatively, the resin layer may be formed by injecting the resin material into the cavity adjacent to the second ceramic layer from the surface serving as the side surface of the multilayer substrate.

Meanwhile, the resin layer containing the void-forming material may be formed by adding the void-forming material to the resin material. The above-described hollow beads may be used as the void-forming material.

In addition, as the situation demands, a Ni plating film may be formed and a Au plating film may be formed on the electrode formed on the surface of the multilayer substrate. Further, electronic component and the like may be mounted on the electrode.

Second Embodiment

In the multilayer substrate according to the present embodiment, the location of the resin layer is any one outermost layer or both outermost layers of the multilayer substrate. The resin layer located as the outermost layer is adjacent to the second ceramic layer. Other configurations may be the same as in the multilayer substrate according to the first embodiment.

Figure 4:
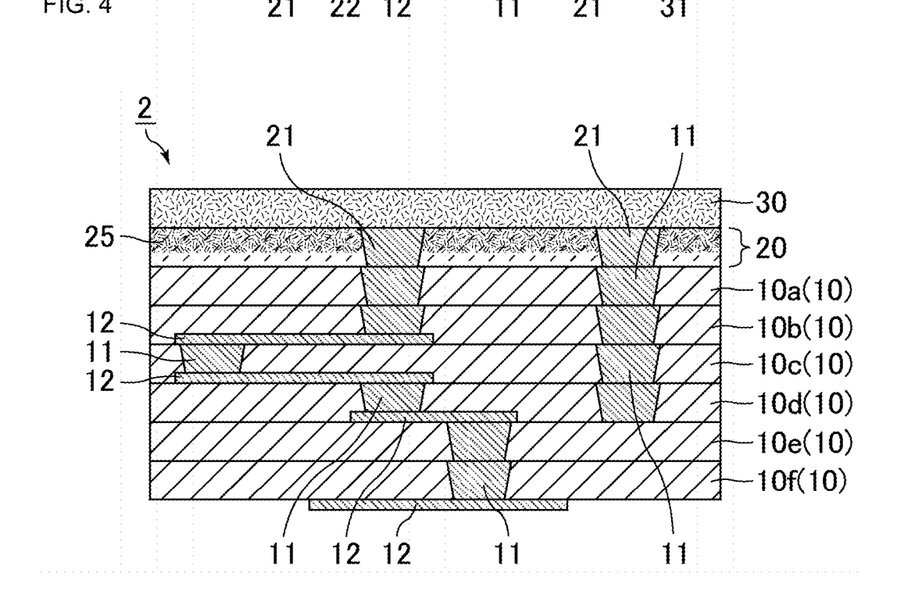
FIG. 4 is a schematic sectional view showing another example of the multilayer substrate according to the present invention.

FIG. 4 is a schematic sectional view showing another example of the multilayer substrate according to the present invention. The multilayer substrate 2 includes first ceramic layers 10 (10a, 10b, 10c, 10d, 10e, and 10f) that are dense bodies, a second ceramic layer 20 having open pores, and a resin layer 30. The second ceramic layer 20 is adjacent to the resin layer 30, and a material for forming the resin layer 30 diffuses into the second ceramic layer 20 (region indicated by reference 25 in FIG. 4). In the multilayer substrate 2, the resin layer 30 is disposed as the outermost layer of the multilayer substrate. FIG. 4 shows the example of the multilayer substrate in which the resin layer 30 is provided with neither interlayer connection metal conductor nor metal wiring line. However, the resin layer 30 may be provided with an interlayer connection metal conductor and a metal wiring line.

Provided that a substrate having a configuration in which the second ceramic layer 20 in the multilayer substrate 2 shown in FIG. 4 is replaced by the first ceramic layer serving as a dense body is adopted as the multilayer substrate including ceramic layers and resin layers in the related art, a warp (concave warp when the resin layer is the upper side in FIG. 4) occurs due to a difference in the thermal expansion coefficient between the first ceramic layer and the resin layer. On the other hand, in the case of the configuration of the multilayer substrate 2 shown in FIG. 4 that is the multilayer substrate according to the present invention, since the second ceramic layer 20 does not shrink compared with the first ceramic layer 10, there is a tendency to warp convexly from the relationship between the two layers. When the resin layer 30 is disposed on the second ceramic layer 20, there is a tendency to warp concavely due to shrinkage of the resin during curing. Consequently, a convex warp of the substrate that occurs from the relationship between the second ceramic layer 20 and the first ceramic layer 10 is reformed, and a flat substrate with no warp is obtained.

FIG. 4 shows an example of the multilayer substrate in which the resin layer is located as one of the outermost layers of the multilayer substrate. However, regarding the multilayer substrate according to the present embodiment, the resin layers may be located as the respective outermost layers of the multilayer substrate. In this case, the second ceramic layers are also located inside the respective outermost layers of the multilayer substrate.

The multilayer substrate according to the present invention may be produced by, for example, the following steps. In the steps, it is not necessary to use the cavity-forming sheet. For example, each of the first ceramic green sheets and the second ceramic green sheet that is described in the method for producing the multilayer substrate according to the first embodiment is produced, and a multilayer body before firing in which stacking is performed such that the second ceramic green sheet is arranged as the outermost layer is produced. Subsequently, the firing step is performed at a firing temperature that is higher than or equal to the sintering temperatures of the first ceramic material and the metal conductor paste contained in each layer and that is lower than or equal to the sintering temperature of the second ceramic material.

A ceramic substrate in which the second ceramic layer is disposed on the first ceramic layers is obtained through the firing step. Since the second ceramic layer having open pores is located as the outermost layer of the ceramic substrate, the open pores of the second ceramic layer are impregnated with a liquid containing the resin material by coating the second ceramic layer as the outermost layer of the ceramic substrate with the liquid containing the resin material. Thereafter, the resin material is cured and, thereby, a multilayer substrate in which the resin layer adjacent to the second ceramic layer is disposed and the material for forming the resin layer has diffused into the second ceramic layer can be produced.

To dispose the interlayer connection metal conductor and the metal wiring line in or on the resin layer, patterning may be performed by using a method for forming a wiring line pattern on the resin substrate after forming the resin layer.

The interlayer connection metal conductor and the metal wiring line formed in or on the resin layer by this method are not metal conductors integrated with the interlayer connection metal conductors in the second ceramic layer.

EXAMPLES

Examples that disclose a resin circuit board according to an embodiment of the present invention more specifically will be shown below. In this regard, the present invention is not limited to the examples.

Example 1

A powder containing $SiO_2$, $Al_2O_3$, and $BaCO_3$ serving as a ceramic powder was subjected to wet mixing and pulverization, and drying was performed so as to obtain a mixture. The resulting mixture was heat-treated so as to obtain a raw material powder for forming the first ceramic green sheet. An organic binder, a dispersing agent, and a plasticizer were added, and mixing and pulverization were performed so as to produce a slurry. The resulting slurry was formed into the shape of a sheet on a base material film by a doctor blade method and dried so as to obtain the first ceramic green sheets while adjusting the thickness such that the thickness after firing became a predetermined thickness.

Via holes were formed in the first ceramic green sheets by using a laser, and the via holes were filled with a metal conductor paste. In addition, wiring lines were formed by screen printing using the metal conductor paste. Cu serving as a metal material and the above-described ceramic powder were contained in the metal conductor paste used, and the proportion of Cu in the metal conductor paste was determined such that the proportion of Cu contained in the metal conductor after firing was set to be 40% by weight.

A slurry was produced by mixing a glass powder and a varnish component into an alumina powder having an average particle diameter of 1 μm and performing mixing and dispersion by using a three-roll mill. The proportion of the alumina powder in the slurry was 48% by weight. The resulting slurry was formed into the shape of a sheet on a base material film by the doctor blade method and dried so as to obtain the second ceramic green sheets while adjusting the thickness such that the thickness after firing became a predetermined thickness. Via holes were formed in the second ceramic green sheets by using a laser, and the via holes were filled with a metal conductor paste. In addition, wiring lines were formed by screen printing using the metal conductor paste. The metal conductor paste used was set to be the same as the metal conductor paste used for the first ceramic green sheet.

An organic binder, a dispersing agent, and a plasticizer were added to carbon, and mixing and pulverization were performed so as to obtain a slurry. The resulting slurry was formed into the shape of a sheet on a base material film by the doctor blade method and dried so as to obtain a carbon sheet having a thickness of 30 μm while adjusting the thickness such that the thickness after firing became a predetermined thickness. Via holes were formed in the carbon sheet by using a laser, and the via holes were filled with a metal conductor paste. In addition, wiring lines were formed by screen printing using the metal conductor paste. The metal conductor paste used was set to be the same as the metal conductor paste used for the first ceramic green sheet.

The carbon sheet was interposed between the second ceramic green sheets, the first ceramic green sheets were further arranged outside the second ceramic green sheets, and heat-pressure bonding was performed so as to obtain a multilayer body before firing. The multilayer body was fired at 950° C. for 1 hour in a low-oxygen atmosphere. As a result, as shown in FIG. 3, a substrate in which a cavity was formed and, in addition, the first ceramic layers that were dense bodies and the second ceramic layers that had open pores were formed was obtained. The resulting cavity was impregnated with a liquid containing a fluororesin having a tensile modulus of elasticity of 0.4 GPa as a resin material, and the fluororesin was cured by heat treatment so as to form the resin layer.

In the above-described steps, a multilayer substrate in which the fluororesin diffused into the second ceramic layers was obtained.

In example 1, the porosity of the second ceramic layer was 5%. A substrate of 10 mm square×t of 1 mm was produced, and a numerical value of the porosity of the second ceramic layer was calculated from the ratio of the bulk density determined before formation of the resin layer to the true density. In this regard, the average pore diameter of pores of the second ceramic layer before firing the resin layer was determined by a mercury penetration method and was 10 μm or less.

Examples 2 to 7

Multilayer substrates were produced, where the porosity of the second ceramic layer was changed as shown in Table 1. The porosity of the second ceramic layer was adjusted by changing the firing temperature.

Comparative Example 1

A multilayer substrate having the same configuration as in example 1 was produced except that a ceramic layer that was a dense body having the same dimensions as the dimensions of the second ceramic layer and that had a composition different from the composition of the first ceramic layer was used instead of the second ceramic layer. Regarding comparative example 1, "-" [%] is entered in the column "Porosity of second ceramic layer [%]" in Table 1.

Comparative Example 2

A multilayer substrate having the same configuration as in example 1 was produced except that the second ceramic layer was not disposed, the first ceramic layer that was a dens body having the same dimensions as the dimensions of the second ceramic layer was disposed instead of the second ceramic layer, and the multilayer substrate was composed of the first ceramic layers that were dense bodies and the resin layer. Regarding comparative example 2, "-" [o] is entered in the column "Porosity of second ceramic layer [%]" in Table 1.

The multilayer substrate produced in each of the examples and the comparative examples was subjected to a drop and impact test and a heat cycle test by the following methods.

(Drop and Impact Test)

The drop and impact test was performed by a method in conformity with JEDEC JESD22-B111. Thirty multilayer substrates were solder-mounted on a test substrate so as to form a daisy chain circuit and were dropped 200 times with an impact acceleration of 1,500 G, 1.0 ms, and a half-sign shock waveform. As a result, the case in which a failure such as breakage, crack, or the like occurred after 200 times of drops was rated as x, the case in which no failure such as breakage, crack, or the like occurred after 200 times of drops was rated as Δ, and the case in which no failure such as breakage, crack, or the like occurred after 300 times of drops performed under the same condition was rated as ◯.

(Heat Cycle Test)

Thirty multilayer substrates were solder-mounted on a test substrate so as to form a daisy chain circuit and were subjected to 250 times of cycles of +85° C. to −40° C. and a maintenance time of 30 min. The case in which a failure such as breakage, crack, or the like occurred was rated as x, the case in which no failure such as breakage, crack, or the like occurred was rated as Δ, and the case in which no failure such as breakage, crack, or the like occurred after 400 times of cycles performed under the same condition was rated as ◯.

TABLE 1

| | Porosity of second ceramic layer [%] | Drop and impact test | Heat cycle test |
|---|---|---|---|
| Example 1 | 5 | Δ | Δ |
| Example 2 | 10 | ◯ | ◯ |
| Example 3 | 30 | ◯ | ◯ |
| Example 4 | 50 | ◯ | ◯ |
| Example 5 | 70 | ◯ | ◯ |
| Example 6 | 80 | ◯ | ◯ |
| Example 7 | 90 | Δ | Δ |
| Comparative example 1 | — | x | x |
| Comparative example 2 | — | x | x |

Regarding the multilayer substrate of each of comparative examples 1 and 2 in which the ceramic layer that was the dense layer and the resin layer were adjacent to each other and the material for forming the resin layer did not diffuse into the ceramic layer, the results of the drop and impact test and the heat cycle test were poor. On the other hand, regarding the multilayer substrate of each example in which the resin layer was adjacent to the second ceramic layer having open pores and the material for forming the resin layer diffused into the second ceramic layer, the results of the drop and impact test and the heat cycle test were good. Regarding examples 2 to 6 in which the porosity of the second ceramic layer was within the range of 10% or more and 80% or less, particularly good results were obtained.

REFERENCE SIGNS LIST 1, 2 multilayer substrate
10, 10a, 10b, 10c, 10d, 10e, 10f first ceramic layer 11, 21, 31 metal conductor
12, 22, 32 metal wiring line
20, 20a, 20b second ceramic layer
25, 25a, 25b relaxation portion
30 resin layer
40 cavity-forming sheet
50 cavity
100 multilayer body before firing
110, 110a, 110b, 110c, 110d first ceramic green sheet
111, 121, 131 interlayer connection metal conductor paste
112, 122, 132 wiring line formed by using metal conductor paste
120, 120a, 120b second ceramic green sheet
150 substrate after firing

The invention claimed is:

1. A multilayer substrate comprising:
a first ceramic layer that is a dense body;
at least two second ceramic layers that each have open pores, at least one of the at least two second ceramic layers being adjacent the first ceramic layer; and
a resin layer between opposing second ceramic layers of the at least two second ceramic layers, wherein an integrally formed continuous resin portion comprising a resin of the resin layer extends from the resin layer into the open pores of each of the opposing second ceramic layers, and wherein the resin layer includes an interlayer connection metal conductor and a metal wiring line therein.

2. The multilayer substrate according to claim 1, wherein the first ceramic layer is composed of a sintered ceramic material and the at least two second ceramic layers are composed of an unsintered ceramic material.

3. The multilayer substrate according to claim 1, wherein the first ceramic layer comprises a low-temperature-sintering ceramic.

4. The multilayer substrate according to claim 1, wherein a first sintering temperature of a first ceramic material of the first ceramic layer is lower than a second sintering temperature of a second ceramic material of the at least two second ceramic layers.

5. The multilayer substrate according to claim 1, wherein the at least two second ceramic layers comprise an unsintered ceramic material.

6. The multilayer substrate according to claim 1, wherein the at least two second ceramic layers have a three-dimensional network structure.

7. The multilayer substrate according to claim 6, wherein the three-dimensional network structure is in a region located at a depth of 1 μm to 100 μm from a surface of each of the opposing second ceramic layers.

8. The multilayer substrate according to claim 7, wherein the region has a portion in which a ceramic-resin composite material composed of a material of the resin layer and the second ceramic material exists.

9. The multilayer substrate according to claim 1, wherein a porosity of the at least two second ceramic layers is 10% to 80%.

10. The multilayer substrate according to claim 1, wherein a porosity of the at least two second ceramic layers is 30% to 60%.

11. The multilayer substrate according to claim 1, wherein an average pore diameter of the open pores of the at least two second ceramic layers is 10 μm or less.

12. The multilayer substrate according to claim 1, wherein a relative permittivity εr of the resin layer is 1.5 to 3.

13. The multilayer substrate according to claim 1, wherein the resin layer contains void-forming materials.

14. The multilayer substrate according to claim 13, wherein a proportion of the void-forming materials in the resin layer is 20% by volume or more.

15. The multilayer substrate according to claim 1, wherein a thickness of the resin layer is 2 μm to 300 μm.

16. The multilayer substrate according to claim 1, wherein a thermal expansion coefficient of a portion of the opposing second ceramic layers where the integrally formed continuous resin portion comprising the resin of the resin layer is extends from the resin layer into the open pores of each of the opposing second ceramic layers is between a thermal expansion coefficient of a material of the opposing second ceramic layers and a thermal expansion coefficient of the resin of the resin layer.

* * * * *